United States Patent [19]

Shino

[11] Patent Number: 5,256,894
[45] Date of Patent: Oct. 26, 1993

[54] SEMICONDUCTOR DEVICE HAVING VARIABLE IMPURITY CONCENTRATION POLYSILICON LAYER

[75] Inventor: Katsuya Shino, Yokohama, Japan

[73] Assignee: Kabushiki Kaisha Toshiba, Kawasaki, Japan

[21] Appl. No.: 729,027

[22] Filed: Jul. 12, 1991

[30] Foreign Application Priority Data

Jul. 13, 1990 [JP] Japan .................. 2-185604

[51] Int. Cl.$^5$ .................. H01L 29/04; H01L 21/44
[52] U.S. Cl. .................. 257/388; 257/383; 257/384; 257/385; 257/413; 257/755; 257/756; 257/757; 257/770; 437/191; 437/192; 437/200
[58] Field of Search .................. 357/23, 59; 257/383, 257/384, 385, 388, 413, 755-757, 770; 437/191, 192, 200

[56] References Cited

U.S. PATENT DOCUMENTS

| 4,584,760 | 4/1986 | Okazawa | 29/571 |
| 4,755,865 | 7/1988 | Wilson | 357/59 |
| 4,945,070 | 7/1990 | Hsu | 357/59 |

FOREIGN PATENT DOCUMENTS 0000317 1/1979 European Pat. Off. .
0173524 3/1986 European Pat. Off. .

OTHER PUBLICATIONS

Patent Abstracts of Japan, vol. 13, No. 74 (E-717) Feb. 20, 1989, & JP-A-63 255 964 (Toshiba Corp.) Oct. 24, 1988.

V. L. Rideout, IBM Technical Disclosure Bulletin, "Fabrication Low Resistance Intercooection Lines and Fet Gates in a Single Step", vol. 21, No. 3, Aug. 1978, pp. 1250-1251.

Dan Peters, IEEE Transactions on Electron Devices, "Implanted-Silicided Polysilicon Gates for VLSI Transistors", vol. ED-33, No. 9, Sep. 1986, pp. 1391-1393.

Primary Examiner—Edward Wojciechowicz
Attorney, Agent, or Firm—Foley & Lardner

[57] ABSTRACT

The present invention relates to a semiconductor device used as a gate electrode or interconnection, in which a polysilicon layer in a laminate comprising a polysilicon layer doped with an impurity and a refractory metal silicide layer has an impurity concentration that is reduced close to a boundary between the polysilicon layer and the refractory metal silicide layer. With this structure, the difference in oxidation speed between the polysilicon layer and the silicide layer is smaller in comparison with a conventional structure, and thus peeling due to bird's beaks can be prevented. The semiconductor device of this structure can be realized by a two-layer polysilicon structure in which the upper layer in contact with the refractory metal silicide layer has a lower impurity concentration, or by a structure in which the peak of the impurity concentration profile is set to be deep within the polysilicon layer during ion implantation.

7 Claims, 2 Drawing Sheets

SEMICONDUCTOR DEVICE HAVING VARIABLE IMPURITY CONCENTRATION POLYSILICON LAYER

BACKGROUND OF THE INVENTION

The present invention relates to a semiconductor device that includes a MOS transistor having a gate electrode or interconnection formed as a layer of a refractory metal silicide deposited over a polysilicon layer, and, in particular, to such a semiconductor device that can be used in an extremely small transistor device.

As the degree of integration of semiconductor devices increases, it is becoming more common for design rules to lie in the so-called submicron region, for example, at 0.7 μm. The structure of an electrode or interconnection of this type of semiconductor device is as shown in FIG. 4C. A gate electrode or interconnection 405 is formed of a polysilicon layer 402 doped with an impurity by a method such as phosphorous diffusion in a region surrounded by an element isolation oxide film 406 on a silicon substrate 401, a refractory metal (high melting point metal) silicide layer 403 of tungsten or molybdenum is deposited over the polysilicon layer 402, and subsequently a post-oxidation film 404 is formed thereon.

This structure is formed as follows. First, the field oxide film 406 used to isolate neighboring elements is formed on the silicon substrate 401 by a selective oxidation method such as LOCOS, using a silicon nitride film as an oxide-resistant film, and a gate oxide film 407 is formed by thermal oxidation on the surface of the silicon substrate 401 in a region surrounded by the field oxide film 406. A polysilicon layer 408 is then deposited over the entire surface, and an impurity such as phosphorous is implanted and diffused thereinto to obtain a polysilicon layer doped to a high concentration with an impurity (FIG. 4A).

Next, a refractory metal silicide layer 409 is deposited over this impurity-doped polysilicon layer 408, a photoresist layer 410 formed on the silicide layer 409 is exposed and developed, and this is used as an etching mask to selectively remove the polysilicon layer 408 and the silicide layer 409 (FIG. 4B) to obtain the patterned polysilicon layer 402 and the refractory metal silicide layer 403. Oxidation is then performed to complete the gate electrode or interconnection 405 by forming the post-oxidation film 404 surrounding the polysilicon layer 402 and the refractory metal silicide layer 403 (FIG. 4C).

However, the impurity concentration of the polysilicon layer of this semiconductor device having a gate electrode or interconnection is much higher than that of the silicide layer, so the oxidation rate of the polysilicon layer directly under the silicide layer is higher during the post-oxidation, and oxidized portions called bird's beaks are generated thereby, as denoted by 410 in FIG. 4C. These bird's beaks exert stress on the refractory metal silicide layer, which is a cause of peeling of the refractory metal silicide layer in the processing steps subsequent to post-oxidation. This peeling of the refractory metal silicide layer greatly increases the resistance of the gate electrode or interconnection, leading to defects of the device.

Experiments have shown that no peeling of the silicide layer due the above bird's beaks occurs during subsequent processing in a device in which an impurity is thinly implanted into the polysilicon layer under the conditions of phosphorous diffusion for 30 minutes in an atmosphere at 850° C., but such peeling of the refractory metal silicide layer due to bird's beaks does occur in a device in which ions are implanted thickly into the polysilicon layer by implantation of $As_+$ ions at a dosage of $1 \times 10^{15}$ cm$^{\times 2}$ and an acceleration energy of 60 KeV in addition to the phosphorous diffusion for 30 minutes in an atmosphere at 850° C., and also in a device in which an impurity is thickly implanted into the polysilicon layer under the condition of phosphorous diffusion for 60 minutes in an atmosphere containing $POCl_3$ gas at 850° C.

In the above element in which peeling of the refractory metal silicide layer due the above bird's beaks does not occur, the impurity concentration increases the resistivity of the gate or causes depletion in the region of the gate oxidation layer in the polysilicon, so it is preferable that the impurity concentration of the polysilicon layer should be maintained at a high level.

As described above, the semiconductor device of this conventional structure has the problem that bird's beaks are generated during post-oxidation in the boundary portion between the polysilicon layer and the silicide layer.

SUMMARY OF THE INVENTION

Therefore, it is an objective of the present invention to provide a semiconductor device and a method of manufacture thereof designed to prevent the generation of bird's beaks in a gate electrode or interconnection during post-oxidation.

According to one aspect of the present invention, there is provided a semiconductor device provided with a polysilicon layer doped with an impurity and deposited on a semiconductor substrate, and a refractory metal silicide layer deposited over the polysilicon layer; wherein the concentration of the impurity included in the polysilicon layer is reduced in the vicinity of the boundary between the polysilicon layer and the refractory metal silicide layer to lower than that in another part thereof; and the laminate of the polysilicon layer and the high melting point metal silicide layer is used as a gate electrode or interconnection.

According to another aspect of the present invention, there is provided a method of manufacturing a semiconductor device comprising: a step of forming a insulating film on a surface of a semiconductor substrate; a step of depositing a first polysilicon layer over the insulating film; a step of performing impurity diffusion with respect to the first polysilicon layer; a step of depositing a second polysilicon layer over the first polysilicon layer; a step of depositing a refractory metal silicide layer over the second polysilicon layer; and a step of selectively removing the first polysilicon layer, the second polysilicon layer, and the refractory metal silicide layer to form a gate electrode or interconnection.

In accordance with the present invention, the impurity concentration in the polysilicon layer close to the boundary thereof with the refractory metal silicide layer is reduced. Therefore, the difference in oxidation speed between the polysilicon layer and the silicide layer can be made lower than that in a conventional structure, and peeling due to bird's beaks can be prevented.

BRIEF DESCRIPTION OF THE DRAWINGS

In the accompanying drawings.

DESCRIPTION OF THE PREFERRED EMBODIMENTS

Embodiments of the present invention will be described below with reference to the attached drawings.

Figure 1A:
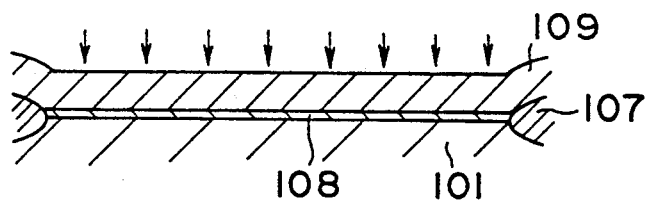
FIGS. 1A–1C are cross-sections through the semiconductor device in accordance with a first embodiment of the present invention during the manufacture thereof.
Figure 1B:
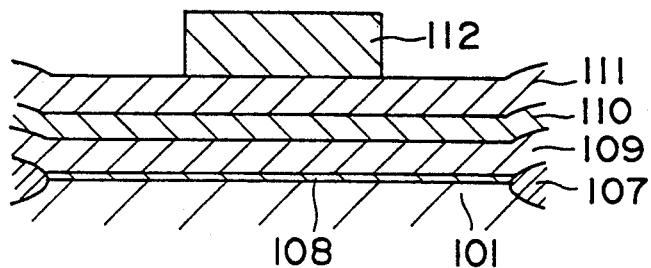
Figure 1C:
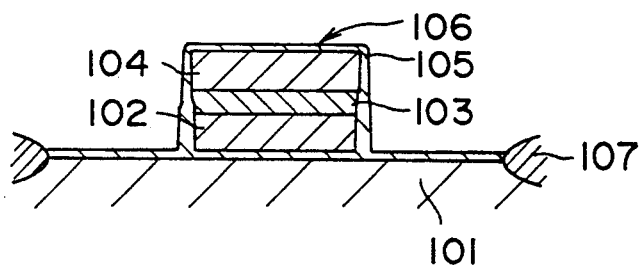

Cross-sections through the semiconductor device in accordance with a first embodiment of the present invention during the manufacture thereof are shown in FIGS. 1A to 1C.

First of all, as shown in FIG. 1C, the completed semiconductor device in accordance with this embodiment of the present invention is formed of a gate electrode 106 comprising a first polysilicon layer 102, a second polysilicon layer 103, and a refractory metal silicide layer 104 formed on a silicon substrate 101 in a region surrounded by an element isolation film 107, with a post-oxidation film 105 formed thereon.

In this case, the resistance of the first polysilicon layer 102 is reduced by the inclusion of a high concentration of an impurity implanted by phosphorous diffusion. The second polysilicon layer 103 has a lower impurity concentration than the first polysilicon layer 102, either because no impurity diffusion processing is performed on the second polysilicon layer 103, even taking into account impurities due to thermal diffusion from the first polysilicon layer 102 during the post-oxidation, or because a method such as ion implantation is used to perform impurity diffusion processing to a lower concentration than in the first polysilicon layer 102.

The first polysilicon layer 102 is deposited on a gate oxide layer on the silicon substrate 101, and the second polysilicon layer 103 is deposited on the first polysilicon layer 102. This configuration places the second polysilicon layer 103, which has a low impurity concentration, directly below the refractory metal silicide layer 104, so that the impurity concentration profile included within the layer formed of the first polysilicon layer 102 and the second polysilicon layer 103 is such that the concentration drops with nearness to the boundary surface, in the vicinity of the boundary of the silicide layer 104.

As a result, since the first polysilicon layer 102 and the second polysilicon layer 103 are formed of the same substance, adhesion therebetween is ensured. Since the second polysilicon layer 103 has a low impurity concentration at the boundary between the second polysilicon layer 103 and the silicide layer 104, the oxidation speed of the second polysilicon layer 103 during post-oxidation does not greatly exceed that of the silicide layer 104, and hence bird's beaks can be prevented from forming in the boundary therebetween, so that adhesion between the two layers 103 and 104 is ensured.

The impurity concentration of the second polysilicon layer 103 should preferably be no more than 80% of the peak value of the impurity profile of the first polysilicon layer 102. Setting the concentration to such a level will ensure that the above peeling of the silicide layer due to bird's beaks is prevented.

The method of manufacturing the semiconductor device of the above structure is described below.

First, a thick oxide film 107 for element isolation is formed by a selective oxidation method such as LOCOS on the silicon substrate 101 whose surface has been polished to a mirror finish, then a thin oxide film 108 that will form the gate oxide film is formed by thermal oxidation on the silicon substrate surface in a region thereof surrounded by the oxide film 107.

Next, a first polysilicon layer 109 is deposited over both the thermal oxide film 108 and the element isolation oxide film 107, and phosphorous is diffused to a high concentration as an impurity into the first polysilicon layer 109 by placing the element in a diffusion source gas such as $POCl_3$, as shown in FIG. 1A.

Then a second polysilicon layer 110 is deposited on top of the first polysilicon layer 109, and a refractory metal silicide layer 111 such as a tungsten silicide layer or a molybdenum silicide layer is deposited on top of the second polysilicon layer 110, as shown in FIG. 1B.

In this case, the impurity diffused into the second polysilicon layer 110 has a lower concentration than the impurity concentration in the first polysilicon layer 109, which can be provided by a method such as ion implantation.

A photoresist layer 112 formed on the silicide layer 111 is exposed and developed to create a pattern, and this pattern is used as an etching mask to selectively remove parts of the first polysilicon layer 109, second polysilicon layer 110, and silicide layer 111. This forms the first polysilicon layer 102, second polysilicon layer 103, and silicide layer 104. Subsequently, the element is placed in a high-temperature oxidation atmosphere to form the post-oxidation film 105, thus completing the gate electrode 106 (FIG. 1C).

Figure 2A:
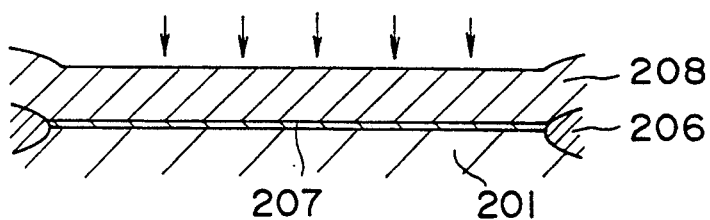
FIGS. 2A–2C are cross-sections through the semiconductor device in accordance with a second embodiment of the present invention during the manufacture thereof.
Figure 2B:
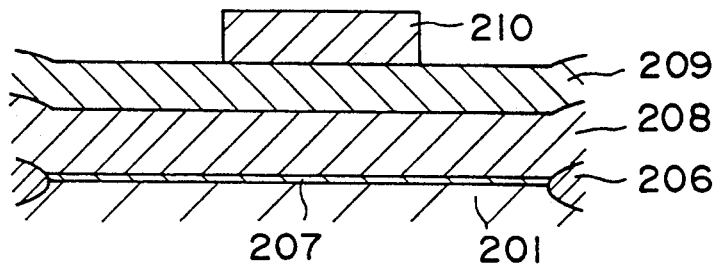
Figure 2C:
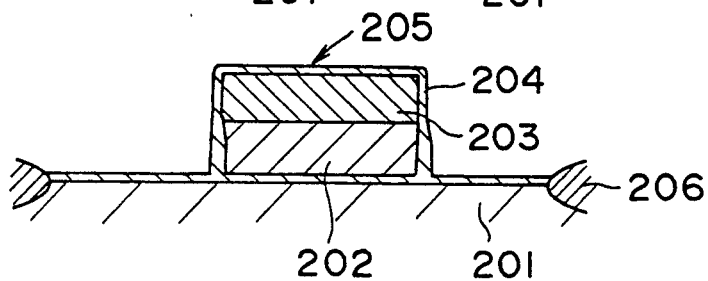

Cross-sections through the semiconductor device in accordance with a second embodiment of the present invention during the manufacture thereof are shown in FIGS. 2A to 2C.

First of all, as shown in FIG. 2C, the completed semiconductor device in accordance with this embodiment of the present invention is formed of a gate electrode 205 comprising a polysilicon layer 202 and a refractory metal silicide layer 203 formed on a silicon substrate 201 in a region surrounded by an element isolation film 206, with a post-oxidation film 204 formed thereon.

In this case, the impurity concentration of the polysilicon layer 202 is created by impurity diffusion by ion implantation that is controlled in such a manner that the concentration profile has a peak placed deep in the polysilicon layer 202, and the concentration is reduced closer to the boundary with the refractory metal silicide layer 203. This ensures that the impurity concentration included within the polysilicon layer 202 has a profile that is reduced with nearness to the boundary with the refractory metal silicide layer 203, in the vicinity of that boundary. In other words, the impurity concentration in the polysilicon layer 202 at the boundary with the refractory metal silicide layer 203 is no more than 80% of the peak in the profile thereof.

The method of manufacturing the semiconductor device of the second embodiment is described below in FIGS. 2A.–C.

First, a thick oxide film 203 for element isolation is formed by a selective oxidation method such as LOCOS on the silicon substrate 201 whose surface has been polished to a mirror finish, then a thin oxide film 202 is formed by thermal oxidation on the silicon substrate surface in a region thereof surrounded by the element isolation oxide film 203.

Next, a polysilicon layer 208 is deposited over both the thermal oxidation film 207 and the element isolation oxide film 206, and an impurity is implanted to a high concentration thereinto by ion implantation, as shown in FIG. 2A. During this process, a special characteristic is imparted to the impurity concentration profile of this embodiment.

Figure 3:
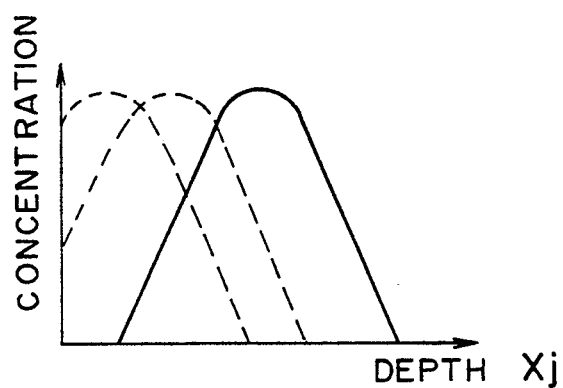
FIG. 3 is a graph of impurity concentration profiles in polysilicon layers doped with impurities.
Figure 4A:
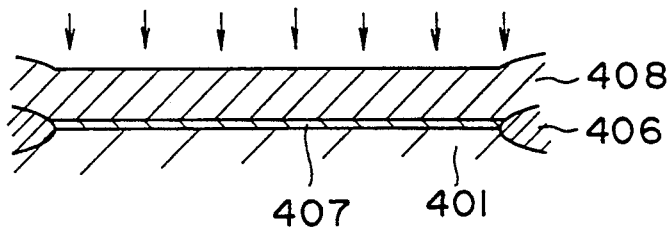
FIGS. 4A–4C are cross-sections through a conventional semiconductor device during the manufacture thereof.
Figure 4B:
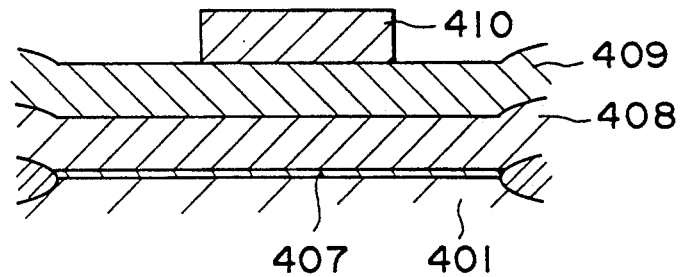
Figure 4C:
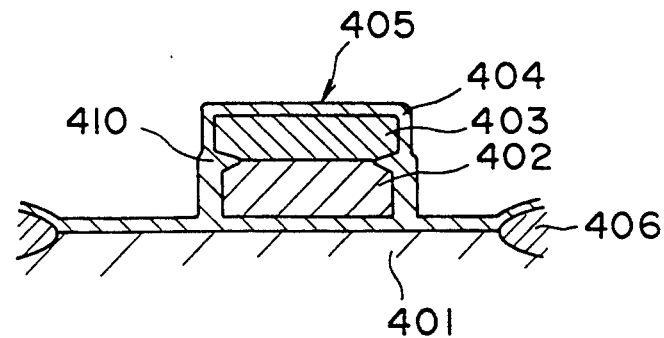

In general, if concentration distribution is plotted such that depth through the polysilicon layer is along the horizontal axis and impurity concentration is along the vertical axis, it will have a humped profile, as shown in FIG. 3. The position of this peak can be controlled by regulating the acceleration energy in this figure, the broken lines show profiles in which the peak position is comparatively shallow and the solid line shows a profile of a case in accordance with the present invention in which the peak position is deep. Therefore, if doping is controlled in such a manner that this peak position is placed deep into the layer as shown by the solid-line curve in the figure, the impurity concentration can be reduced close to the boundary between the polysilicon layer 202 and the refractory metal silicide layer 203. In this embodiment, this result is used to ensure that the peak of the profile of the impurity concentration with respect to the polysilicon layer 208 is controlled during the ion implantation in such a manner that it is placed deep in the polysilicon layer 208.

Subsequently, a refractory metal silicide layer 209 is deposited over the polysilicon layer 208. A photoresist layer 210 formed over the refractory metal silicide layer 209 is then patterned (FIG. 2B) and used as an etching mask to selectively remove parts of the polysilicon layer 208 and silicide layer 209. The element is then placed in a high temperature oxidation atmosphere to grow a post-oxidation film 204 thereon, thus completing the gate electrode 205 (FIG. 2C).

Note that, although the above description concerns a gate electrode, the same structure can also be used to form interconnections.

What is claimed is:

1. A semiconductor device having a multilayer structure used as at least one of a gate electrode and an interconnection, said multilayer structure comprising:
   a polysilicon layer doped with an impurity and deposited on a semiconductor substrate; and
   a refractory metal silicide layer deposited on said polysilicon layer,
   said impurity included in said polysilicon layer having a profile in which the concentration is lower in the vicinity of the boundary between the polysilicon and the refractory metal silicide layer than the concentration in a portion away from the boundary.

2. A semiconductor device in accordance with claim 1, wherein the impurity concentration at the boundary between said polysilicon layer and said refractory metal silicide layer is no more than 80% of a peak in the impurity concentration.

3. A semiconductor device in accordance with claim 1, wherein said polysilicon layer has a two-layer structure comprising a first polysilicon layer deposited over a gate oxide film and a second polysilicon layer deposited over said first polysilicon layer, wherein the impurity concentration in said second polysilicon layer is lower than that in said first polysilicon layer.

4. A semiconductor device in accordance with claim 1, wherein the impurity concentration of said polysilicon layer is controlled in such a manner that a peak thereof is deep within said polysilicon layer, and the concentration thereof is reduced in the vicinity of the boundary thereof with said refractory metal silicide layer.

5. A method of manufacturing a semiconductor device having a multilayer structure used as at least one of a gate electrode and an interconnection, comprising the steps of:
   forming a insulating film on a surface of a semiconductor substrate;
   depositing a first polysilicon layer on said insulating film;
   performing impurity ion implantation and diffusion with respect to said first polysilicon layer;
   depositing a second polysilicon layer on said first polysilicon layer;
   depositing a refractory metal silicide layer on said second polysilicon layer;
   selectively removing said first polysilicon layer, said second polysilicon layer, and said refractory metal silicide layer to form a gate electrode or an interconnection; and
   heating the device to form a post-oxidation film for covering the surface of said gate electrode or interconnection and to diffuse impurity ions in said first polysilicon layer into said second polysilicon layer, thereby making the second polysilicon layer have a lower impurity concentration than does the first polysilicon layer.

6. A method of manufacturing a semiconductor device in accordance with claim 5, wherein the impurity concentration in said second polysilicon layer is no more than 80% of that in said first polysilicon layer.

7. A method of manufacturing a semiconductor device having a multilayer structure used as at least one of a gate electrode and an interconnection, comprising the steps of:
   forming an insulating film on a surface of a semiconductor substrate;
   depositing a polysilicon layer over said insulating film;
   performing ion implantation in such a manner that a peak in the impurity concentration profile with respect to said polysilicon layer is placed at a portion away from a surface of the polysilicon layer within said polysilicon layer;
   depositing a refractory metal silicide layer over said polysilicon layer; selectively removing said polysilicon layer and said refractory metal silicide layer to form a gate electrode or interconnection; and
   forming a post-oxidation film to cover the surface of said gate electrode or interconnection.

* * * * *